United States Patent [19]

Sansregret

[11] 4,289,602
[45] Sep. 15, 1981

[54] ELECTROCHEMICAL OXIDATION OF AMORPHOUS SILICON

[75] Inventor: Joseph L. Sansregret, Scotch Plains, N.J.

[73] Assignee: Exxon Research and Engineering Co., Florham Park, N.J.

[21] Appl. No.: 150,243

[22] Filed: May 15, 1980

[51] Int. Cl.$^3$ .................. C25D 5/00; H01L 31/04
[52] U.S. Cl. .................. 204/32 S; 204/385; 204/56 R; 136/255; 136/258; 357/2; 357/15; 357/30
[58] Field of Search .................. 136/255, 258; 357/2, 357/15, 30; 204/56 R, 32 S, 38 A, 38 S

[56] References Cited

U.S. PATENT DOCUMENTS 3,377,258  4/1968  Schmidt et al. .................. 204/15
4,117,506  9/1978  Carlson .................. 357/30

OTHER PUBLICATIONS

R. J. Stirn et al., "Single Crystal & Polycrystalline GaAs Solar Cells Using AMOS Technology", *Conf. Record,* 12th *IEEE Photovoltaic Specialists Conf.,* 1976, pp. 883-892.

*Primary Examiner*—Aaron Weisstuch
*Attorney, Agent, or Firm*—Paul E. Purwin

[57] ABSTRACT

The invention teaches an electrochemical process for electrolysis growth of an oxide layer on hydrogenated amorphous silicon. Embodied in a photovoltaic device, the oxide layer increases the open circuit voltage of the device and enhances the longevity of the photovoltaic characteristics of the device.

7 Claims, 1 Drawing Figure

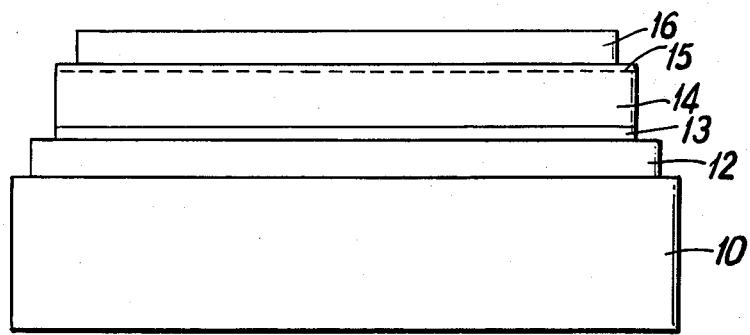

ELECTROCHEMICAL OXIDATION OF AMORPHOUS SILICON

BACKGROUND OF THE INVENTION

The present invention relates to amorphous silicon semiconductor devices and more particularly to hydrogenated amorphous silicon devices having thin insulating oxide layers electrochemically grown by anodizing a surface of the silicon body.

The use of an insulating layer for altering the junction forming characteristics of semiconductor materials is well known in the art of crystalline semiconductor materials such as single crystal silicon. A relatively thin insulating oxide layer is generally interposed between the semiconductor body and a junction forming material. The thin oxide layer is sufficient to alter the materials' junction forming characteristics yet concurrently permit conduction through the insulator by electron or hole tunneling through the oxide. The term tunneling, as known to those of the art, refers generally to the ability of a charge carrier (electron or hole) under the influence of an electric field to pass through a narrow insulating region to allowable energy levels on the far side of the junction even though these charge carriers have insufficient energy to surmount the barrier formed between the insulator and the semiconductor material.

Thicker oxide layers are used in "field effect devices" where the oxide forms the dielectric in induced charge field controlled conduction in a semiconductor.

These oxide layers are conventionally either grown from the surface of the semiconductor or deposited onto the semiconductor from an extrinsic source. The term "grown" collectively represents the varied technique for oxidizing a surface region of the semiconductor material. The present invention teaches a technique for the electrochemical growth of an oxide layer from the surface of hydrogenated amorphous silicon.

PRIOR ART

Production of hydrogenated amorphous silicon is generally known in the art as are numerous techniques for forming junction devices such as P-N junctions, heterojunctions P-I-N structures and Schottky Junctions.

M-I-S structures have been formed using hydrogenated amorphous silicon and various oxide layers. For example, in a technical publication entitled *MIS Solar Cells on Amorphous Silicon*, Conf. Record, 13th IEEE, Photovoltaic Specialists Conf. June 1978, J. B. Wilson et al teach an amorphous silicon photovoltaic cell having a TiOx layer interposed between the semiconductor and the junction forming metal. In U.S. Pat. No. 4,117,506, Carlson et al discloses an amorphous silicon photovoltaic MIS structure having a thin (10 Å-50 Å) insulating layer. Alternate techniques of forming the oxide layer, each known in the art, are discussed at Col. 6, line 49 et seq. In contrast to the prior art, the present invention teaches an electrochemical anodization of a surface region of the amorphous silicon. The technique is used to favorably alter the junction forming characteristics of the amorphous silicon material and concurrently provides a protective layer to enhance the longevity of the photovoltaic characteristics of the device.

Electrochemical anodization of crystalline silicon is known in the art. For example, in a technical publication *Anodic Formation of Oxide Films on Silicon*, J. Electrochemical Soc., April 1957 page 230 et seq., P. F. Schmidt et al teach an electrochemical anodizing technique for single crystal silicon. A similar technique is disclosed by G. C. Jain et al in a technical publication entitled *On the Mechanism of the Anodic Oxidation of Si at Constant Voltage*, J. Electrochem. Soc., January 1979 page 90 et seq. Each of these processes relate to anodization of crystalline silicon, whose material and semiconductor properties differ substantially from amorphous silicon.

SUMMARY OF THE INVENTION

The present invention teaches a technique for controlled electrochemical anodization of hydrogenated amorphous silicon. Relatively thin oxide layers, comprising SiOx, where $1 \leq X \leq 2$, are grown on an etched surface of the amorphous silicon. An electrolyte comprising a solvent having a dielectric constant equal to or greater than about 25, to which a conductive supporting ion is added is used to anodize the silicon film using either constant current and constant voltage anodization. Embodied in a photovoltaic device, a metal-insulator-semiconductor structure displays substantially increased open circuit voltages and enhanced permanence of the photovoltaic properties of the structure.

BRIEF DESCRIPTION OF THE DRAWINGS

In the single FIGURE accompanying the present invention, there is shown a cross sectional view of an amorphous silicon device whose dimensions have been substantially enlarged for the purpose of illustration.

DETAILED DESCRIPTION OF THE INVENTION

The present invention is directed to an electrochemically grown oxide layer on hydrogenated amorphous silicon. The practice of the present invention requires the formation of a layer of hydrogenated amorphous silicon. As recited heretofore, producing hydrogenated amorphous silicon films is known in the art. Alternate techniques of glow discharge decomposition of silane or sputtering in partial pressures of hydrogen are conventionally used to provide controlled hydrogen content silicon films. The amorphous semiconductor material is generally characterized as having no long range order in periodicity of the matrix. An amount of hydrogen, incorporated into the semiconductor during its formation, gives rise to and is believed to be a dominant factor in controlling the magnitude of photoconductivity in the semiconductor. Photoconductive amorphous silicon is generally characterizable as having an intrinsic dark bulk conductivity of between about $10^{-6}$ $(\Omega\text{-cm})^{-1}$ and about $10^{-10}$ $(\Omega\text{-cm})^{-1}$ and a light conductivity of between about $10^{-4}$ $(\Omega\text{-cm})^{-1}$ and $10^{-3}$ $(\Omega\text{-cm})^{-1}$ when irradiated with 100 mW of white light.

Referring to the drawing, in the typical preparation of this film of hydrogenated amorphous silicon, a substrate 10 comprises a material which is known to form an ohmic contact to amorphous silicon. The term ohmic contact is used in the art to define the ability of an electrode to form a substantially non-blocking contact to a semiconductor material, non-perferentially extracting or injecting holes or electrons. Alternatively, a layer 12 comprising a material forming the above described ohmic contact may be interposed between substrate 10 and the amorphous silicon layer. In a preferred embodiment, layer 12 comprises a thin film of nichrome sputter deposited onto a major area surface of a borosilicate glass substrate 10.

In one embodiment of the present invention, silicon layer 14 is vacuum deposited by means of a radio frequency sustained (hereinafter RF) glow discharge decomposition of silane, ($SiH_4$). An initial region 13 contiguous to the ohmic electrode, may preferably be doped $N^+$ to insure the ohmicity of the contacting electrode. The addition of phosphine gas with the phosphine/silane ratio ranging from about 3/1000 to about 3/100 will dope the deposition of amorphous silicon $N^+$. The initial region 13 may extend between about 50 Å and 500 Å into the body of the amorphous silicon layer after which the dopant gas supply is deleted and the deposition proceeds with the composition of pure silane to form intrinsic amorphous silicon.

Typically, the deposition parameters for the glow discharge decomposition of silane include providing a vacuum chamber evacuated to a pressure below about $10^{-5}$ torr. A partial pressure of silane, $SiH_4$, ranging from about 30 millitorr to about 50 millitorr, backfills the evacuated chamber, whereafter the partial pressure of silane is maintained by controlling the input flow rate of silane at about 10 cc/min while concurrently throttling the pumping speed of the evacuating system. An RF power supply is capacitively coupled to the gas content of the vacuum chamber by appropriately spaced parallel plate electrodes. This well known technique of coupling RF energy to an ionizable gas media is utilized to decompose the silane, depositing an amorphous silicon film containing hydrogen. As known in the art, the substrate to be coated may either be held contiguous to, or be in the vicinity of the anode electrode. Also known to those of the art is the requirement that the substrate be heated during the deposition. Typically the substrate will be maintained at a temperature between about 250° C. and about 350° C., dependent upon the accompanying deposition parameters. At an RF frequency of about 13.56 MHz and an input power level ranging from about 60 watts to about 80 watts, a film thickness between about 1 micron and about 3 microns may be deposited between about 40 minutes and about 120 minutes.

A substantially similar technique for glow discharge decomposition of silane substitutes a DC power source for the discharge sustaining power supply. The substrate to be coated is held contiguous to the cathode electrode which is sustained at a temperature of between about 250° C. and about 350° C. The DC power source supplies a potential of between about 700 volts and 800 volts between the anode and cathode electrode. A partial pressure of silane is maintained between about 800 millitorr and about 850 millitorr. These deposition parameters typically produce an amorphous silicon film ranging in thickness from about 1 micron to about 5 microns in a time period of about 10 minutes.

A further alternative for depositing amorphous silicon is reactive sputtering in a partial pressure of hydrogen. In one embodiment, substrates of borosilicate glass which have been previously coated with a nichrome layer are loaded into a vacuum system which is then pumped to a base pressure of about $5 \times 10^{-7}$ torr. Argon is then throttled through the system to achieve a steady state partial pressure of between about 0.25 and about 1.0 millitorr. The substrates are maintained at a temperature of between about 200° C. and 300° C. during deposition and power densities are maintained at about 1–2 watts per $cm^2$ of cathode. Typically, a one micron thick film is deposited between about 40 minutes and about 60 minutes. As described for the previous glow decomposition techniques, extrinsic dopants such as phosphine, diborane or similar known doping gases may be introduced into the vacuum chamber during the deposition to alter the semiconductor characteristics for particular desired device configurations.

The above described deposition techniques for producing thin film photo conductive amorphous silicon are generally known in the art and are included to illustrate several of the variant deposition techniques for producing this material.

Semiconductor layer 14 is then subjected to an etching process which comprises contacting the surface of layer 14 with an appropriate etchant. A preferred solution comprises hydrofluoric acid in water; however, alkali metal hydroxides such as NaOH may also be used.

The etching of the silicon provides a standard surface for the subsequent oxide growth. The term standard surface, as used herein, denotes a surface whose chemical composition is approximately that of the bulk material and is substantially free of other chemical compounds such as oxides and further extrinsic materials, gases or the like absorbed onto the silicon surface. The etching duration, solution concentration and temperature are interrelated. Typically, the etchant concentration will range from 27 Molar (hereinafter abbreviated as M) to about 12 M; the temperature of the etching process will range from about 18° C. to about 30° C. and the duration of the etching from about 1 minute to about 5 minutes.

In a preferred embodiment, the silicon layer is immersed in an 18.4 M hydrofluoric acid solution maintained at about 18° C. for a period of about 1 minute, rinsed in distilled deionized water and blown dry. The specimen may be maintained under cover of inert gas to advantage.

The etched silicon film is transferred to a conventionally arranged anodizing apparatus. The apparatus generally includes an electrolyte well, a cathode electrode comprising a conductor which is inert to the electrocorrosive nature of the anodizing process, specimen mounting means including means for making electrical contact to the silicons' ohmic electrode 10 and/or 12 and a saturated calomel electrode (hereafter abbreviated SCE). The cathode electrode and the specimen are coupled to the respective negative and positive terminals of a power supply. The power supply selectively provides either constant current or constant voltage between the SCE and the anodes. In an alternate embodiment, the power supply may provide alternating current or voltage power, or other waveform variations in the supplied power. These alternate electrochemical techniques are known in the art and are clearly within the scope of the present invention.

An electrolyte comprises a solution of a solvent having a dielectric constant greater than or equal to about 25 and a supportive oxygen containing anion where during electrolysis the electrolyte is difficultly discharged (decomposed) leading to decomposition of the anion at the anode. Examplary solvents include water, ethanol, ethylene glycol, methyl-acetamide, ethylene glycol monoethers, or mixtures thereof. An anodizing anion soluble in the solvent and supporting conduction in the electrolyte comprises oxygen containing species such as nitrates ($NO_3^-$), sulfates ($SO_4^=$) hydroxides ($OH^-$) and salicylates ($C_7H_5O_3^-$).

Particular anodizing anions which may be added in solution as a solute comprise $KNO_3$, NaOH, KOH, $K_2SO_4$ or sodium salicylate ($NaC_7H_5O_3$). A preferred electrolyte comprises a 0.1 normal solution of $KNO_3$ in water.

The electrolyte fills the anodizing well covering a major portion of the cathode electrode and a portion of the silicon specimen limited to the silicon layer. Electrolyte stirring means may be provided to advantage. The temperature of the electrolyte is typically maintained at about 18° C. to about 30° C. during electrolysis.

For constant current anodizing having an anodizing current of about 25 $\mu A/cm^2$, the anodization voltage varies from about 0.5 volts to about 1.0 volts as measured with respect to SCE. For the above recited electrolysis parameters, an oxide layer 15 ranging from about 10 Å to about 50 Å is grown in between about 1.0 minute and 5 minutes.

In an alternate embodiment, a constant potential electrolysis at an anodization voltage of about 2 volts measured with respect to SCE, and an electrolysis current varying from about 100 $\mu A$ to about 30 $\mu A$ produced an oxide layer 15 ranging in thickness from about 20 Å to about 50 Å for an anodization time ranging from about 1 minute to about 3 minutes. The cell is completed by application of semitransparent Schottky junction forming layer 16.

To assist one skilled in the art, the following examples detail several specific embodiments of the present invention:

EXAMPLE 1

A plurality of borosilicate glass substrates, having a major surface virtually free of protrusions of the order of 1 micron or greater, were scrupulously cleaned to remove foreign matter. The substrates were transferred to a conventional sputtering system where their major surface was coated with a 1000 Å layer of nichrome, a metal alloy known to form an ohmic contact to amorphous silicon and particularly to amorphous silicon doped N+. The coated substrates were transferred to a vacuum deposition chamber adapted to provide glow discharge decomposition of silane in the deposition of photoconductive amorphous silicon. The deposition apparatus included a pyrex bell jar about 30 cm high and about 15 cm in diameter held in vacuum contact to a stainless steel base plate. A pumping station comprising selectably alternative pumping means of the mechanical and diffusion types is utilized to evacuate the deposition chamber to pressures below about $10^{-5}$ torr. Pumping speed is controlled by selectively varying the opening and closing of an aperture between the pumping station and the deposition chamber. A cathode electrode comprising a 7.6 cm diameter circular disk of stainless steel, contained a plurality of electro-resistive heating elements embedded within the electrode. The heaters are connected to a conventional temperature controller, capable of maintaining a relatively constant (+2° C.) temperature of the electrode. The substrates may be secured to the heater/cathode electrode by simple mechanical means so long as thermal contact is assured between the cathode electrode and the electrodes on the substrate. A second electrode, the anodic electrode, of similar size and composition is positioned parallel to the cathode electrode and having an interelectrode spacing of about 2.5 cm. After evacuating the deposition chamber, CVD grade silane is bled into the chamber. In a preferred embodiment, silane is bled into the chamber while concurrently pumping to evacuate same, purging the chamber of residual atmospheric gases. Gaseous silane, $SiH_4$, containing about 1% phosphine, $PH_3$, is bled into the evacuated deposition chamber. A gas mixing and control system provides precise mixing and control of gas flow rates. The initial gas flow mixture of silane and phosphine was regulated at 10 standard $cm^3/min$. The pumping speed was regulated to provide a deposition chamber pressure of about 850 millitorr. Radio frequency (R.F.) power supply is connected in a power supplying relation to the anode and cathode electrode respectively. A power density of about 1 watt per $cm^2$ is applied to the cathode electrode. The plasma between the electrodes both decomposes and ionizes the gas content of the chamber in a conventional glow discharge manner. After a deposition period of about 45 seconds which deposits a phosphine doped N+ layer of amorphous silicon about 700 Å in thickness, the supply of phosphine was removed and the system was effectively purged to remove any residual $PH_3$. Pure silane is then fed into the system at a controlled flow rate of about 10 standard $cm^3/min$. The deposition of intrinsic amorphous silicon continues for a period of about 10 minutes to deposit an intrinsic layer about 10 microns in thickness. The deposition system was allowed to cool and was then backfilled to atmospheric pressure with inert gas. Several of the samples were set aside under cover of an inert gas to serve as comparison standards. The remaining samples were then etched in a solution of hydrofluoric acid in water having an acid concentration of about 18.4 molar. The acid etching bath was maintained at a temperature of about 18° C. After an etching period of about one minute, the samples were rinsed in distilled deionized water and blown dry in argon. The samples were then transferred to an anodizing apparatus which comprised an electrolyte reservoir, a platinum cathode electrode, a saturated calomel reference electrode, and a specimen holder for concurrently positioning the specimen within the electrolyte reservoir and providing electrical coupling between the nichrome contact to the amorphous silicon and the positive terminal of a Princeton Applied Research Model 173 Potentiostat/Galvanostat with a Model 176 Current Follower.

An electrolyte comprising a solution of 0.1 normal $KNO_3$ in $H_2O$ filled the reservoir, holding approximately 200 cc's of electrolyte. The electrolyte solution was maintained at a temperature of about 18° C. One of the samples was positioned on the specimen holder/electrode and immersed into the electrolyte, the immersed area being about 1 $cm^2$. Caution was exercised to assure that the nichrome metal electrode was not in direct contact with the electrolyte. A first sample was anodized at a relatively constant current of about 5 $\mu A$ for 150 seconds. A second sample was anodized at a relatively constant current of 25 microamperes for an equal time period of 150 seconds. The two anodized samples along with the control samples were then transferred to a conventional vacuum deposition system and were metallized with a semi-transparent Schottky junction layer of palladium, shown in the drawing at 16. The open circuit voltage of each sample was evaluated while illuminated with approximately 100 mW/$cm^2$ of white light produced by a short arc Xenon lamp suitably filtered to simulate air mass 1 sunlight. The sample which was anodized at the lower current evidenced an open circuit voltage of 0.50 volts compared to the non-anodized control sample which displayed a voltage of about 0.41 volts. The third sample, anodized at 25 μA evidenced an open circuit voltage of 0.63 volts, an increase in excess of 50%.

EXAMPLE 2

The preparation and etching of the amorphous silicon films for example 2 was virtually identical to example 1. An electrolyte comprising a solution of 0.05 normal $KNO_3$ in a solvent comprising 90% 2-methoxy ethanol and 10% $H_2O$ (by volume) was used in the anodization. A first sample was anodized at a constant voltage of 2 volts and a second sample at a constant voltage of 5 volts. The anodized samples metallized with the Schottky metal as in Example 1 evidenced an increase in illuminated open circuit voltage of about 270 millivolts for the sample anodized at 2 volts as compared to the similarly constructed non-anodized comparison samples. The sample anodized at 5 volts showed an increase in illuminated Voc of about 30 millivolts.

EXAMPLE 3

The device construction and anodization process of example 3 was virtually identical to that of Example 2 except that the samples were etched in a NaOH solution having a PH about equal to 11.6. The etchant was maintained at about 18° C. for the duration of etching which was about 150 seconds. The samples, metallized and evaluated as set forth in examples 1 and 2, evidenced a substantial increase in open circuit voltage for the anodized samples as compared to the non-anodized comparison standards.

What is claimed is:

1. A method for producing a device comprising hydrogenated amorphous silicon, comprising the steps of:
   etching a surface region of said silicon to provide a standard surface;
   anodizing said etched surface in an electrolyte comprising an anodizing anion in solution with a solvent having a dielectric constant greater than or equal to about 25 wherein an electrolysis current is maintained between a cathode electrode and the silicon layer, immersed in said electrolyte and comprising an anode electrode, for a time sufficient to electrochemically grow an oxide layer of SiOx from the surface region of the silicon layer ranging in thickness from about 10 Å to about 50 Å; and
   applying a Schottky junction forming metal to said oxide layer.

2. The method of claim 1 wherein said oxide comprises SiOx where x ranges from about 1 to about 2.

3. The method of claim 1 wherein said anion is selected from the group consisting of $NO_3^-$, $OH^-$, salicylate, $SO_4^=$ or combinations thereof.

4. The method of claim 3 wherein said solvent is selected from the group consisting of water, ethanol, ethylene glycol, methylacetamide, ethylene glycol monoethers or combinations thereof.

5. The method of claim 4 wherein the electrolysis current ranges from about 5 μA to about 25 μA at an anodization voltage of about 0.5 volts.

6. The method of claim 1 wherein said junction forming metal comprises palladium.

7. The method of claim 1 wherein said electrolysis current ranges from about 5 μA to about 25 μA at a voltage of 0.5 volts to about 1.0 volts.

* * * * *